United States Patent
Shin et al.

(10) Patent No.: US 7,122,468 B2
(45) Date of Patent: Oct. 17, 2006

(54) METHODS OF FABRICATING INTEGRATED CIRCUIT CONDUCTIVE CONTACT STRUCTURES INCLUDING GROOVES

(75) Inventors: Ju-Cheol Shin, Seoul (KR); Hyeon-Deok Lee, Seoul (KR); Hong-Mi Park, Seoul (KR); In-Sun Park, Geonggi-do (KR)

(73) Assignee: Samsung Electronics Co., Ltd.(KR)

( * ) Notice: Subject to any disclaimer, the term of this patent is extended or adjusted under 35 U.S.C. 154(b) by 2 days.

(21) Appl. No.: 11/039,562

(22) Filed: Jan. 20, 2005

(65) Prior Publication Data

US 2005/0121755 A1  Jun. 9, 2005

Related U.S. Application Data

(62) Division of application No. 10/606,048, filed on Jun. 25, 2003, now abandoned.

(30) Foreign Application Priority Data

Jun. 26, 2002  (KR) ............................ 2002-0035931

(51) Int. Cl.
*H01L 21/4763* (2006.01)
(52) U.S. Cl. ...................................... 438/637; 438/629
(58) Field of Classification Search ................ 438/637, 438/629
See application file for complete search history.

(56) References Cited

U.S. PATENT DOCUMENTS

| 5,563,448 | A | 10/1996 | Lee et al. |
| 6,028,362 | A | 2/2000 | Omura |
| 6,048,792 | A | 4/2000 | Watanabe et al. |
| 6,602,749 | B1 * | 8/2003 | Tu et al. ....................... 438/253 |
| 6,680,538 | B1 * | 1/2004 | Kim et al. ................... 257/751 |
| 2002/0041030 | A1 | 4/2002 | Kim et al. |

* cited by examiner

*Primary Examiner*—Howard Weiss
(74) *Attorney, Agent, or Firm*—Myers Bigel Sibley & Sajovec, P.A.

(57) ABSTRACT

An integrated circuit includes a substrate and a first insulating layer on the substrate that includes a first hole including a floor and a sidewall. A first conductive contact extends conformally on the sidewall and floor to define a groove in the first hole. A second insulating layer is provided on the first insulating layer and includes a second hole that exposes the groove. A second conductive contact is provided in the second hole and in the groove. These integrated circuits are fabricated by forming a first insulating layer on a substrate that includes a first hole including a floor and a sidewall. A first conductive contact is conformally formed on the sidewall and floor to define a groove in the first hole. A second insulating layer is formed on the first insulating layer and includes a second hole that exposes the groove. A second conductive contact is formed in the second hole and in the groove.

10 Claims, 8 Drawing Sheets

US 7,122,468 B2

METHODS OF FABRICATING INTEGRATED CIRCUIT CONDUCTIVE CONTACT STRUCTURES INCLUDING GROOVES

Related Applications

This application is a divisional of application Ser. No. 10/606,048, filed Jun. 25, 2003, filed Jun. 25, 2003, now abandoned which itself claims the benefit of Korean Patent Application No. 2002-0035931, filed Jun. 26, 2002, both of which are assigned to the assignee of the present application, the disclosures of which are hereby incorporated herein by reference in their entirety as if set forth fully herein.

FIELD OF THE INVENTION

The present invention relates to integrated circuit structures and fabrication methods-thereof, and more particularly, to conductive contact structures for integrated circuits and fabrication methods thereof.

BACKGROUND OF THE INVENTION

In semiconductor integrated circuits, conductive contacts are formed so as to electrically connect multi-level interconnections to each other and/or between an interconnection and a substrate. FIG. 1 is a cross-sectional view showing a cell area and a peripheral circuit area of a conventional Dynamic Random Access Memory (DRAM). Reference numerals 80 and 90 represent the cell area and the peripheral circuit area, respectively.

Referring to FIG. 1, in the cell area 80, trench-type device isolation regions 4 defining an active area are formed in a substrate 2. A gate stack, including a gate insulating layer 6, a polysilicon layer 8, a silicide layer 10 and a capping insulating layer 12, is formed on the substrate 2 in which the device isolation regions 4 are formed. Gate spacers 16 are formed on sidewalls of the gate stack. Source/drain regions 19 including lightly doped impurity regions 14 and highly doped impurity regions 18 are formed in the active area adjacent to the gate stack. A first interlayer insulating layer 20 is formed on the substrate 2 that includes the gate stack having the spacers 16 formed on the sidewalls thereof. A bit line contact hole 22 is formed which passes through the first interlayer insulating layer 20. A bit line contact 29 including a barrier metal 26 and a tungsten layer 28 is formed within the bit line contact hole 22. A bit line 32a electrically connected to the bit line contact 29 is formed on the first interlayer insulating layer 20 in which the bit line contact 29 is formed. A second interlayer insulating layer 36 is formed on the bit line 32a and the first interlayer insulating layer 20. An opening 40 is formed to expose the source region 19 through the second interlayer insulating layer 36 and the first interlayer insulating layer 20. The opening 40 is filled with polysilicon to thereby form a contact plug 42. A capacitor including a lower electrode 44, a dielectric layer 46 and an upper electrode 48 is formed on the second interlayer insulating layer 36 in which the contact plug 42 is formed. A third interlayer insulating layer 50 is formed on the capacitor and the second interlayer insulating layer 36. A metal interconnection 62 including a barrier metal 56 and a tungsten layer 58 is formed on the third interlayer insulating layer 50.

In the peripheral circuit area 90, device isolation regions 4 defining an active area are formed on the substrate 2, and a highly doped impurity region 18 is formed in the active area. A lower interlayer insulating layer 20 is formed on the substrate 2. A lower contact hole 24 is formed through the lower interlayer insulating layer 20 to expose the highly doped impurity region 18. A lower contact 30 including a barrier metal 26 and a tungsten layer 28 is formed in the lower contact hole 24. An interconnection line 32b electrically connected to the lower contact 30 is formed on the lower interlayer insulating layer 20 in which the lower contact 30 is formed. An upper interlayer insulating layer 52 is formed on the interconnection line 32b and the lower interlayer insulating layer 20. An upper contact hole 54 is formed through the upper interlayer insulating layer 52 to expose the interconnection line 32b. An upper contact 60 and a metal interconnection 62, each of which includes a barrier metal 56 and a tungsten layer 58, are formed inside the upper contact hole 54 and on the upper interlayer insulating layer 52, respectively. In the peripheral circuit area 90, the highly doped impurity region 18, the interconnection line 32b and the metal interconnection 62 are electrically connected to each other via the lower contact 30 and the upper contact 60.

In the fabrication of the lower contact 30, the lower contact hole 24 exposing the highly doped impurity region 18 is formed on the lower interlayer insulating layer 20, and then the barrier metal 26 and the tungsten layer 28 are formed inside the lower contact hole 24 and on the first interlayer insulating layer 20. Thereafter, the resulting structure may be planarized using a Chemical Mechanical Polishing (CMP) process until a surface of the lower interlayer insulating layer 20 is exposed, thereby forming the lower contact 30. However, the CMP process may cause a well known dishing phenomenon such that the planarized surface is formed in a dish shape. Furthermore, the slurry used in CMP process may cause contamination and particle generation. Accordingly, in order to remove problems associated with contamination and/or particles during CMP process, extra cleaning process may be preformed.

SUMMARY OF THE INVENTION

Some embodiments of the present invention provide an integrated circuit that includes a substrate and a first insulating layer on the substrate that includes therein a first hole passing therethrough that includes a floor adjacent the substrate and a sidewall. A first conductive contact extends conformally on the sidewall and floor to define a groove in the first hole. A second insulating layer is provided on the first insulating layer remote from the substrate and includes therein a second hole passing therethrough that exposes the groove. A second conductive contact is provided in the second hole and in the groove.

In some embodiments, the floor is directly on the substrate. In some embodiments, the second conductive contact fills the second hole and the groove. In some embodiments, the first conductive contact comprises a first barrier layer on the sidewall and floor, and a first conductive layer on the first barrier layer remote from the sidewall. In some embodiments, the second conductive contact also comprises a second barrier layer on the first conductive layer, and a second conductive layer on the second barrier layer remote from the first conductive layer. In some embodiments, the first conductive contact also extends onto the first insulating layer outside the first hole and, in some embodiments, the second conductive contact also extends onto the second insulating layer outside the second hole.

In yet other embodiments, the first insulating layer includes a third hole and a fourth hole passing therethrough, and the second insulating layer includes a fifth hole passing therethrough that exposes the fourth hole. In these embodiments, the integrated circuit further comprises a third conductive contact in the third hole, and a fourth conductive contact in the fourth and fifth holes. In some embodiments, a third insulating layer is provided on the second insulating layer remote from the first insulating layer and includes therein a sixth hole that exposes the second hole. The second conductive contact further extends into the sixth hole. In some embodiments, a capacitor is also provided on the second insulating layer that is electrically connected to the fourth conductive contact. In still other embodiments, the first hole is at least twice as wide as the third hole.

Integrated circuits are fabricated, according to some embodiments of the present invention, by forming a first insulating layer on a substrate that includes therein a first hole passing therethrough that includes a floor adjacent the substrate and a sidewall. A first conductive contact is conformally formed on the sidewall and floor to define a groove in the first hole. A second insulating layer is formed on the first insulating layer remote from the substrate and includes therein a second hole passing therethrough that exposes the groove. A second conductive contact is formed in the second hole and in the groove.

In still other embodiments, the step of forming a first insulating layer comprises forming a first insulating layer on the substrate that includes therein the first hole passing therethrough and a third hole passing therethrough. The step of conformally forming a first conductive contact comprises conformally forming the first conductive contact on the sidewall and floor to define the groove in the first hole and simultaneously forming a third conductive contact in the third hole. The step of forming a second insulating layer is followed by forming a third insulating layer on the second insulating layer remote from the first insulating layer that includes therein a sixth hole that exposes the second hole. The step of forming a second conductive contact comprises forming a second conductive contact in the second hole in the groove and in the sixth hole. In other embodiments, a fifth hole is formed on the second insulating layer, a fourth hole is formed in the first insulating layer beneath the fifth hole and a fourth conductive contact is formed in the fourth and fifth holes.

It will be understood that embodiments of the present invention may be used to form conductive contact structures for any integrated circuit device including but not limited to DRAM devices. Moreover, some method embodiments of the present invention can eliminate the need for at least one CMP step in the integrated circuit contact fabrication process. However, other method embodiments of the present invention may continue to use one or more CMP steps.

DETAILED DESCRIPTION

Figure 1:
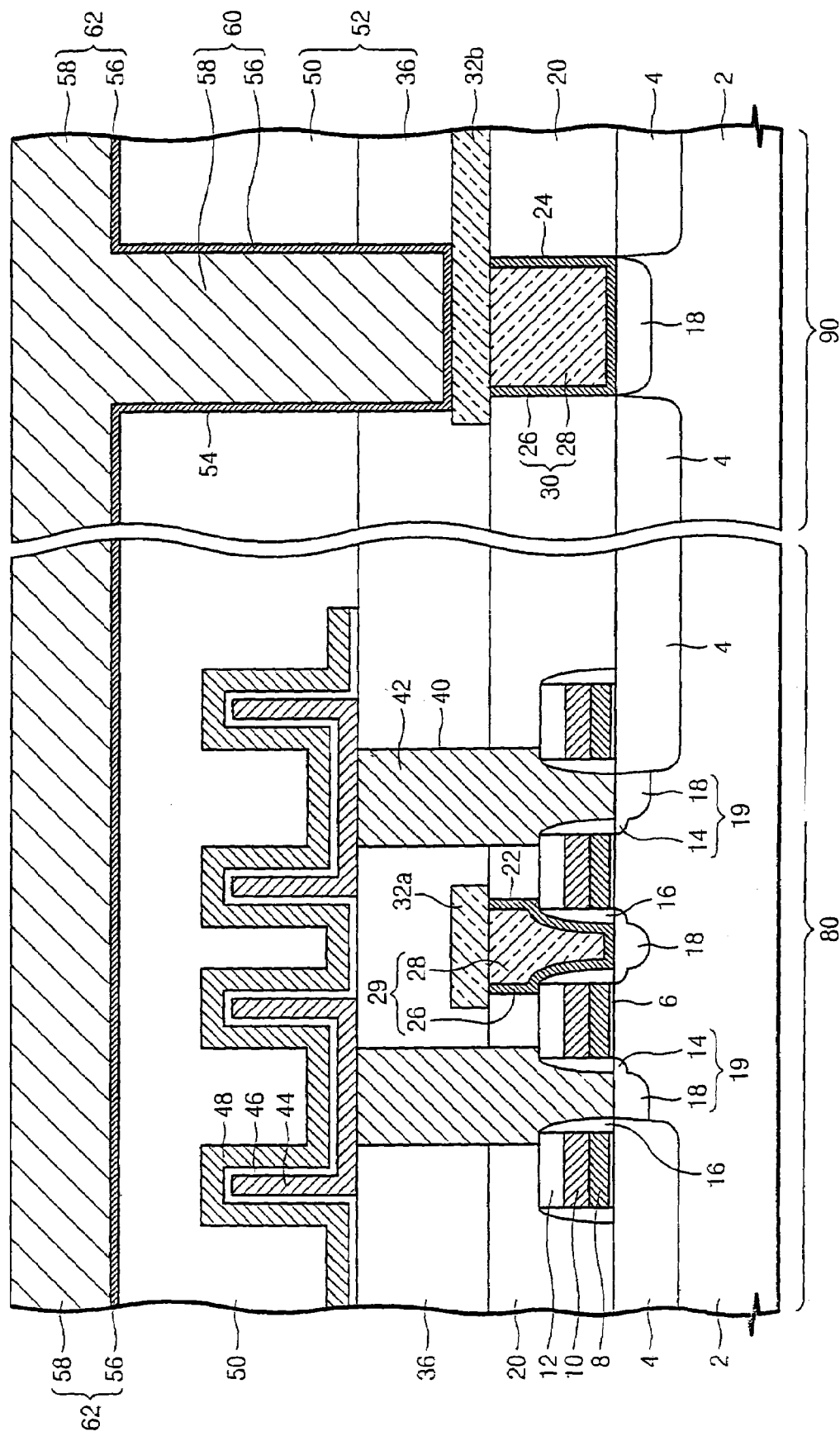
FIG. 1 is a cross-sectional view showing a cell area and a peripheral circuit area of a conventional DRAM.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that although the terms first, second, etc. are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the integrated circuit than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

It will be understood that although embodiments of the present invention are illustrated in FIGS. 2A–7 with respect to a DRAM device, they are not limited to DRAM devices. It also will be understood that although FIGS. 3–7 illustrate methods that can eliminate at least one CMP step, embodiments of the invention are not so limited and can employ one or more CMP steps.

Figure 2A:
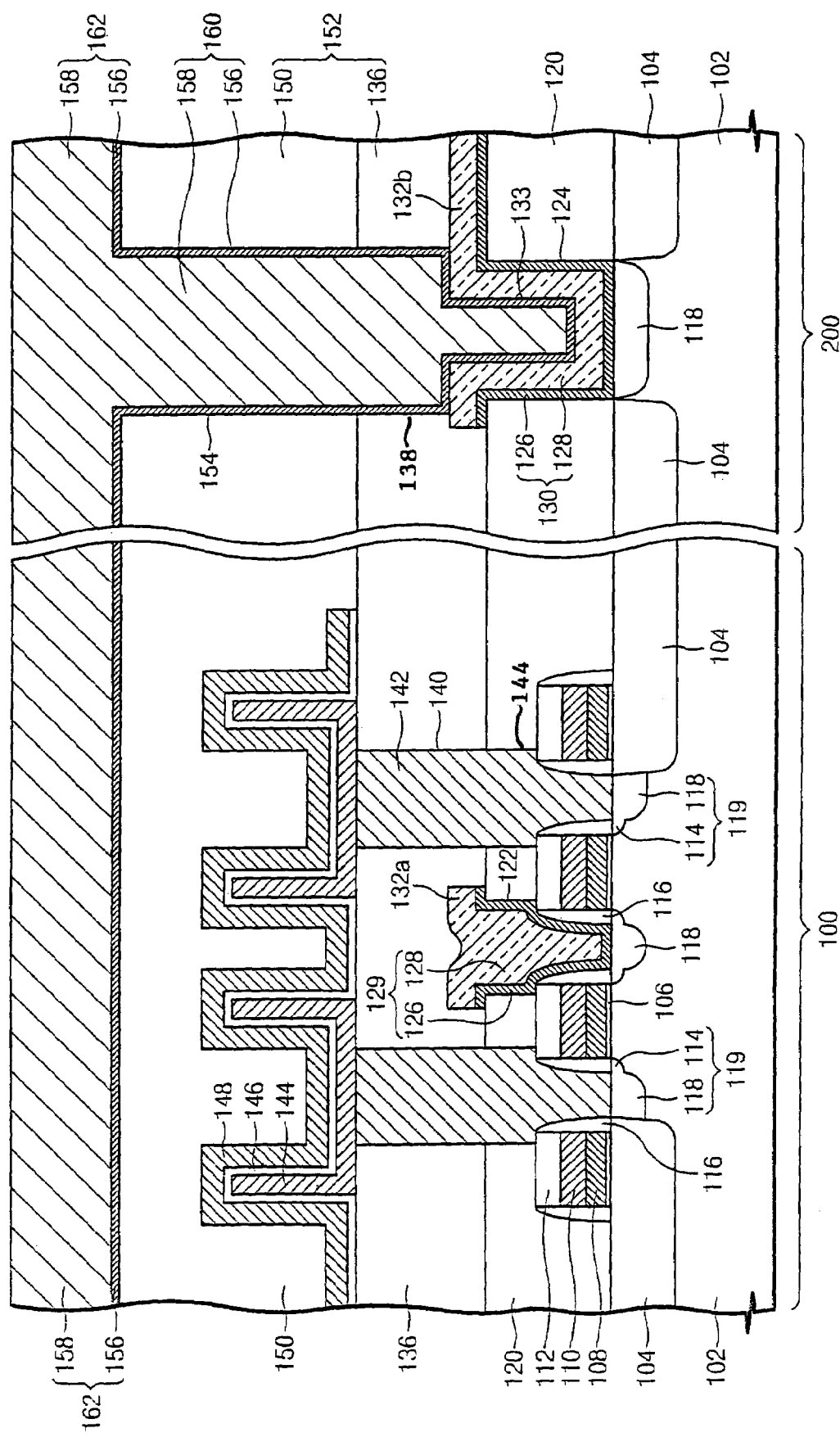
FIGS. 2A and 2B are cross-sectional views showing a cell area and a peripheral circuit area of an integrated circuit such as a DRAM in accordance with embodiments of the present invention.
Figure 2B:
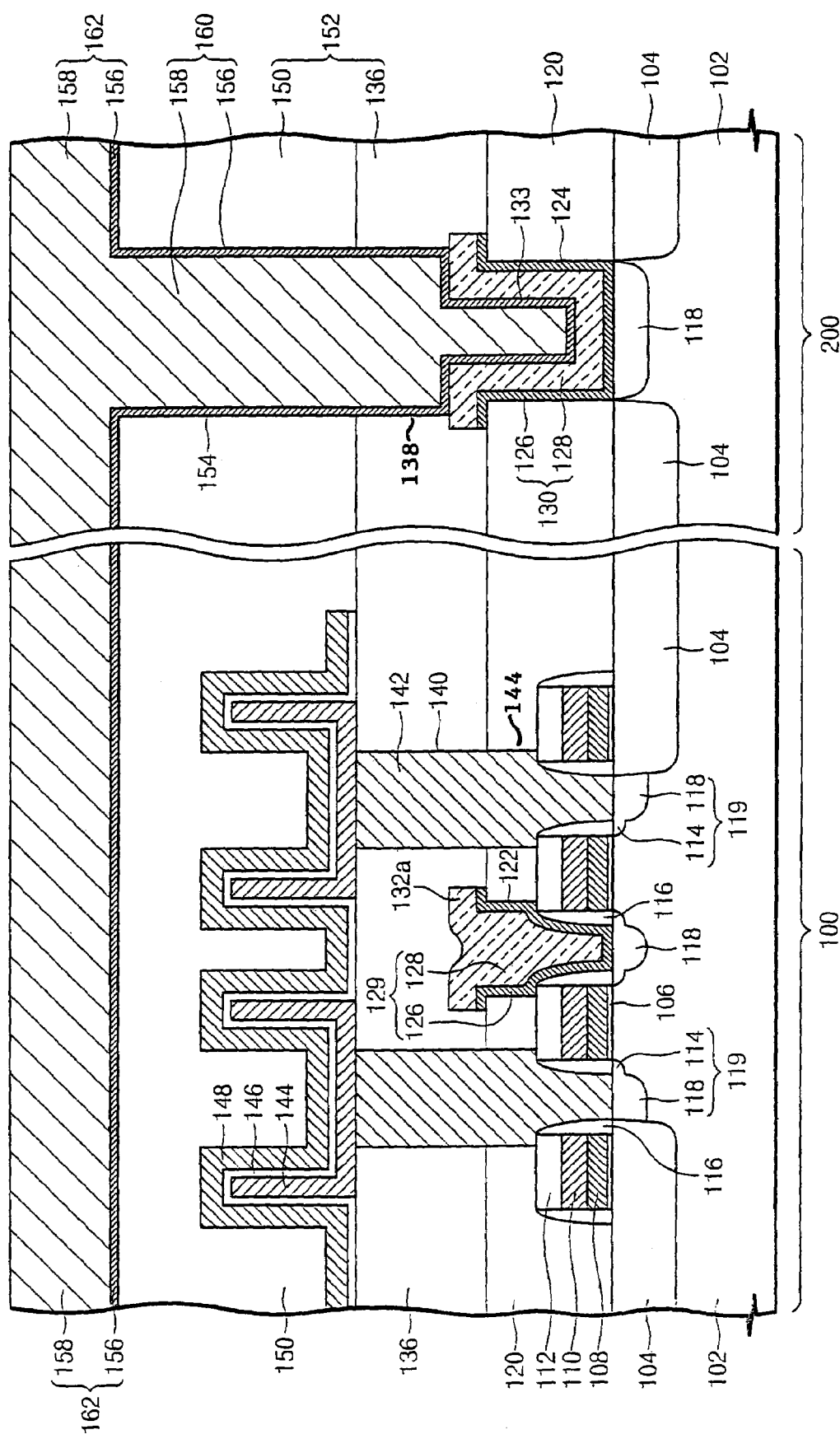

FIGS. 2A and 2B are cross-sectional views of integrated circuits such as integrated circuit DRAMs according to some embodiments of the present invention. As shown in FIGS. 2A and 2B, integrated circuit devices according to some embodiments of the present invention include a substrate 102, such as a conventional monocrystalline silicon substrate, and a first insulating layer 120 on the substrate that includes therein a first hole 124 passing therethrough. The first hole 124 includes a floor adjacent the substrate 102, and a sidewall. A first conductive contact 130 extends conformally on the sidewall and floor to define a groove 133 in the first hole 124. A second insulating layer 136 is provided on the first insulating layer 120 remote from the substrate 102 and includes therein a second hole 138 passing therethrough that exposes the groove 133. A second contact 160 is provided in the second hole 138 and in the groove 133.

In other embodiments, the first insulating layer 120 also includes a third hole 122 and a fourth hole 144 passing therethrough. The second insulating layer 136 also includes a fifth hole 140 passing therethrough that exposes the fourth hole 144. A third conductive contact 129 is provided in the third hole and a fourth conductive contact 142 is provided in the fourth hole 144 and the fifth hole 140.

In still other embodiments, a third insulating layer 150 is provided on the second insulating layer 136 remote from the first insulating layer 120 that includes therein a sixth hole 154 that exposes the second hole 138. The second conductive contact 160 further extends into the sixth hole 154.

Additional detailed description of FIGS. 2A and 2B will be provided relative to a cell area 100 and a peripheral circuit area 200 of a DRAM in accordance with embodiments of the present invention.

Referring again to FIG. 2A, in the cell area 100, device isolation regions 104 defining an active area are formed on a substrate 102. A gate stack, including a gate insulating layer 106, a polysilicon layer 108, a silicide layer 110 and a capping insulating layer 112, is formed on the substrate 102 in which the device isolation regions 104 are formed. Gate spacers 116 are formed on sidewalls of the gate stack. Source/drain regions 119 including lightly doped impurity regions 114 and highly doped impurity regions 118 are formed in the active area adjacent to the gate stack. The first insulating layer 120, also referred to as a first interlayer insulating layer 120, is formed on the substrate in which the gate stack is formed. The third hole 122, also referred to as a bit line contact hole 122, is formed to pass through the first interlayer insulating layer 120 to expose the drain region 119. The third contact 129, also referred to as a bit line contact 129, including a first barrier metal 126 and a first conductive layer 128, is formed inside the bit line contact hole 122. A bit line 132a connected to the bit line contact 129 is formed on the first interlayer insulating layer 120 in which the bit line contact 129 is formed. The second insulating layer 136, also referred to as a second interlayer insulating layer 136, is formed on the bit line 132a and the first interlayer insulating layer 120. A fifth hole 140, also referred to as an opening 140, is formed to pass through the second interlayer insulating layer 136 and the first interlayer insulating layer 120 to expose the source region 119. The opening 140 and the fourth hole 144 are filled with polysilicon, to thereby form the fourth contact 142, also referred to as a contact plug 142. A capacitor including a lower electrode 144, a dielectric layer 146 and an upper electrode 148 is formed on the second interlayer insulating layer 136 in which the contact plug 142 is formed. The third insulating layer 140, also referred to as a third interlayer insulating layer 150, is formed on the capacitor and the second interlayer insulating layer 136. A metal interconnection 162, including a second barrier metal 156 and a second conductive layer 158, is formed on the third interlayer insulating layer 150.

In the peripheral circuit area 200, device isolation regions 104 defining an active area are formed on the substrate 102. A highly doped impurity region 118 is formed in the active area. The first interlayer insulating layer 120 is formed on the substrate. The first hole 124, also referred to as a lower contact hole 124, is formed to pass through the lower interlayer insulating layer 120 to expose the highly doped impurity region 118. The first conductive contact 130, also referred to as a lower contact 130, and an interconnection line 132b, each of which includes a first barrier metal 126 and a first conductive layer 128, are formed inside the lower contact hole 124. It is noted that a groove 133 is formed inside the lower contact 130. An upper interlayer insulating layer 152 is formed on the lower contact 130, the interconnection line 132b and the lower interlayer insulating layer 120. The sixth hole 154, also referred to as an upper contact hole 154, is formed which passes through the upper interlayer insulating layer 152 to expose the lower contact 130. The second conductive contact 160, also referred to as an upper contact 160, and a metal interconnection 162, each of which includes a second barrier metal 156 and a second conductive layer 158, are formed inside the upper contact hole 154 and the second hole 138, and on the upper interlayer insulating layer 152, respectively.

Referring to FIG. 2B, in some embodiments, the interconnection line 132b is not formed in the peripheral circuit area 200, and the highly doped impurity region 118 can be connected to the metal interconnection 162 via the lower contact 130 and the upper contact 160.

FIGS. 3 to 7 are cross-sectional views showing methods for fabricating conductive contact structures in accordance with embodiments of the present invention. Reference numerals 100 and 200 represent the cell area and the peripheral circuit area, respectively. However, these methods are not limited to memory devices.

Figure 3:
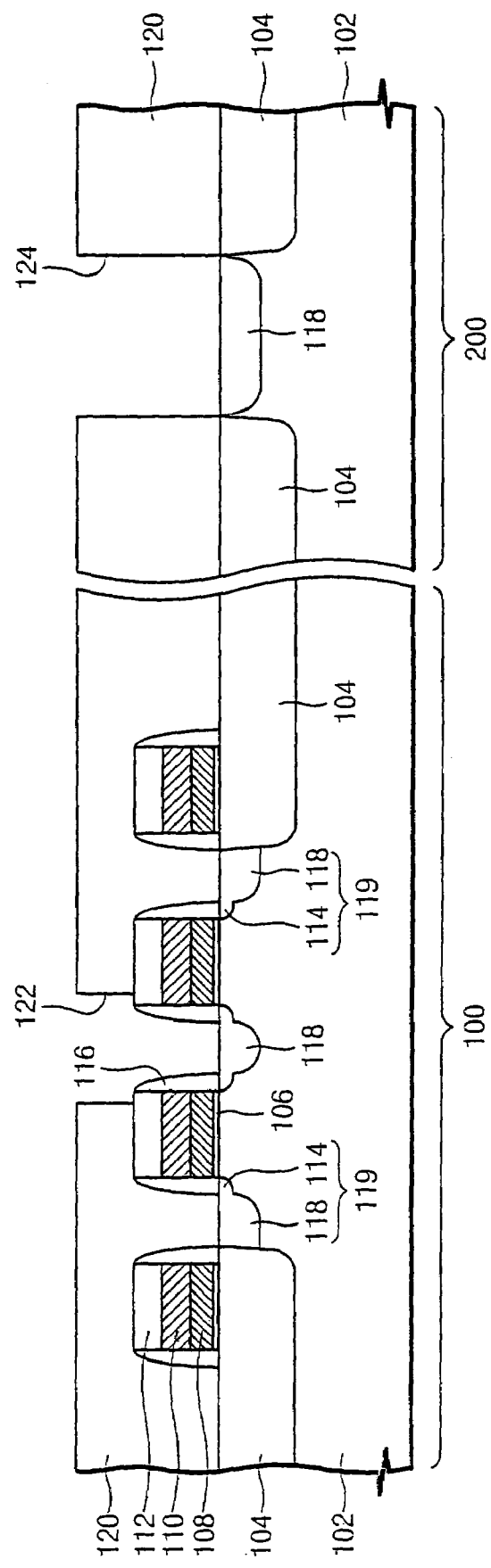
FIGS. 3 to 7 are cross-sectional views showing methods for fabricating a conductive contact structure in accordance with embodiments of the present invention.

Referring to FIG. 3, in the cell area 100, the device isolation regions 104 defining the active area are formed on the substrate 102. In some embodiments, a predetermined portion of the substrate 102 is selectively etched to form a trench. Then, the trench is fully filled with an insulating material and the CMP process is performed to form the device isolation regions 104. Thereafter, the gate insulating layer 106, the polysilicon layer 108, the silicide layer 110 and the capping insulating layer 112 are sequentially stacked on the substrate 102 in which the active area is defined. The capping insulating layer 112, the silicide layer 110, the polysilicon layer 108 and the gate insulating layer 106 are patterned to form the gate stack. The lightly doped impurity region 114 is formed using the gate stack and the device isolation regions 104 as an ion implantation mask. A spacer insulating layer is formed on an entire surface of the substrate in which the gate stack is formed, and an anisotrophic plasma etchback process is performed to form the gate spacer 116 on the sidewalls of the gate stack. Then, the highly doped impurity region 118 is formed using the gate stack and the device isolation region as an ion implantation mask. In the cell area 100, the source/drain region 119 is formed on the lightly doped impurity region 114 and the highly doped impurity region 118. Thereafter, the first interlayer insulating layer 120 is formed on the surface of the substrate in which the gate stack is formed. After the planarization process is carried out, the bit line contact hole 122 is formed using a conventional photo etching process. Other conventional processes may be used to form these structures.

In the peripheral circuit area 200, the device isolation regions 104 defining the active area are formed on the substrate 102. The highly doped impurity region 118 is formed in the active area using the device isolation regions 104 as an ion implantation mask. Then, the lower interlayer insulating layer 120 is formed on the substrate 102 in which the highly doped impurity region 118 and the device isolation regions 104. The lower interlayer insulating layer 120 to form the lower contact hole 124 that exposes the highly doped impurity region 118. At this time, the lower contact hole 124 of the peripheral circuit area is formed wider than the bit line contact hole 122 of the cell area. Other conventional processes may be used to form these structures.

Figure 4:
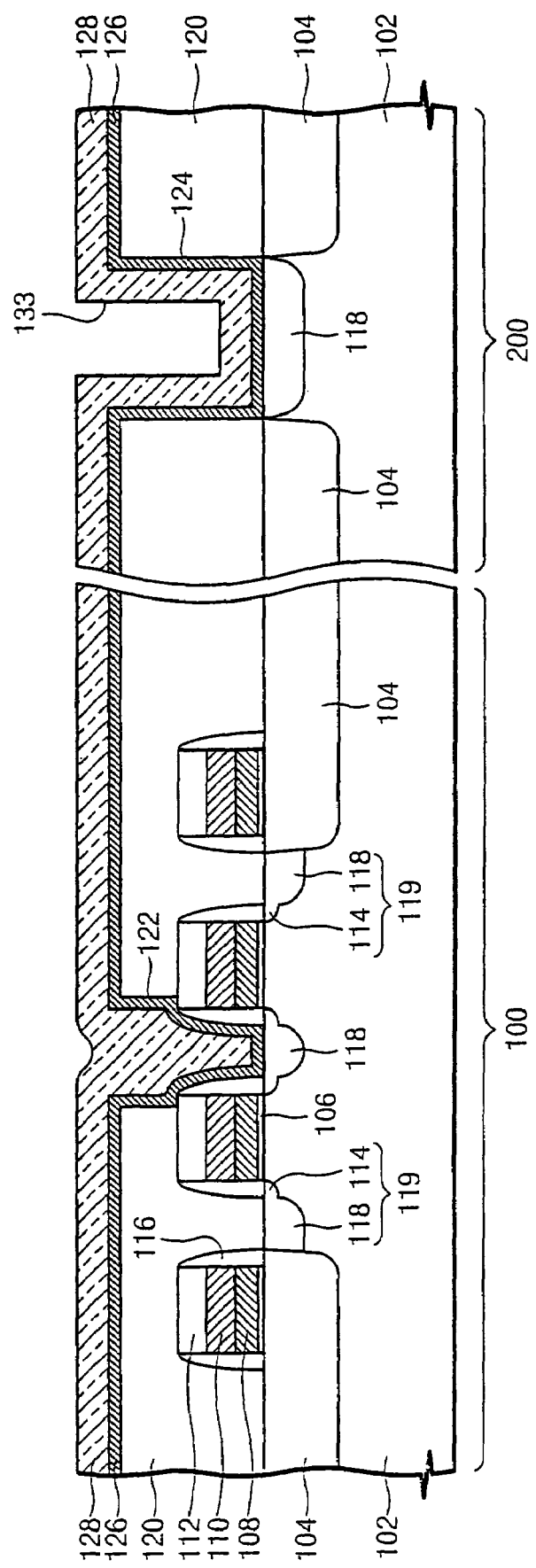

Referring to FIG. 4, in the cell area 100, the first barrier metal 126 is conformally formed inside the bit line contact hole 122 and on an upper portion of the first interlayer insulating layer 120. The first barrier metal 126 can be formed of titanium (Ti) and/or titanium nitride (TiN). A Chemical Vapor Deposition (CVD) process can be used to form the first barrier metal 126. Then, the first conductive layer 128 is conformally formed on the first barrier metal 126. The first conductive layer 128 can be formed of tungsten (W). A CVD process can also be used to form the first conductive layer 128. As shown in FIG. 4, the bit line contact hole 122 of the cell area 100 is fully filled with the first conductive layer 128 in some embodiments.

In the peripheral circuit area 200, the first barrier metal 126 and the first conductive layer 128 are conformally formed inside the lower contact hole 124 and on an upper portion of the lower interlayer insulating layer 120. The lower contact hole 124 of the peripheral circuit area 200 is not fully filled with the first barrier metal 126 and the first conductive layer 128, and a groove 133 is formed in the lower contact hole 124. In some embodiments, this may be accomplished because the first barrier metal 126 and the first conductive layer 128 are not formed thick enough to fully fill the lower contact hole 124 of the peripheral circuit area 200. In particular, in some embodiments, the width of the lower contact hole 124 is more than two times as wide as the thickness of the first barrier metal 126 and the first conductive layer 128. In other embodiments, the lower contact hole 124 is at least twice as wide as the bit line contact hole 122. Moreover, other conventional processes may be used to form these structures.

Figure 5:
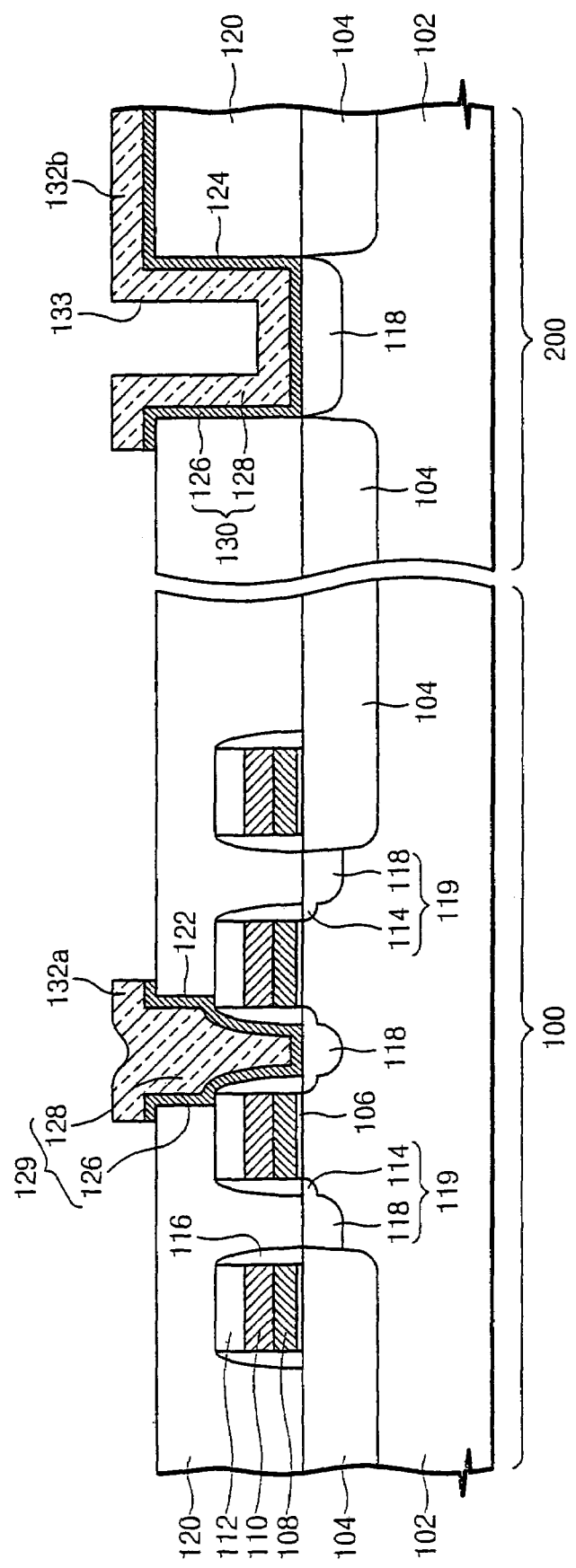

Referring to FIG. 5, in the cell area 100, the first conductive layer 128 and the first barrier metal 126 are patterned using a typical photo etching process to form the bit line contact 129 and the bit line 132a. In the peripheral circuit area 200, the first conductive layer 128 and the first barrier metal 126 are patterned to form the lower contact 130 and the interconnection line 132b. In some cases, only the lower contact 130 is formed without forming the interconnection line 132b.

Figure 6:
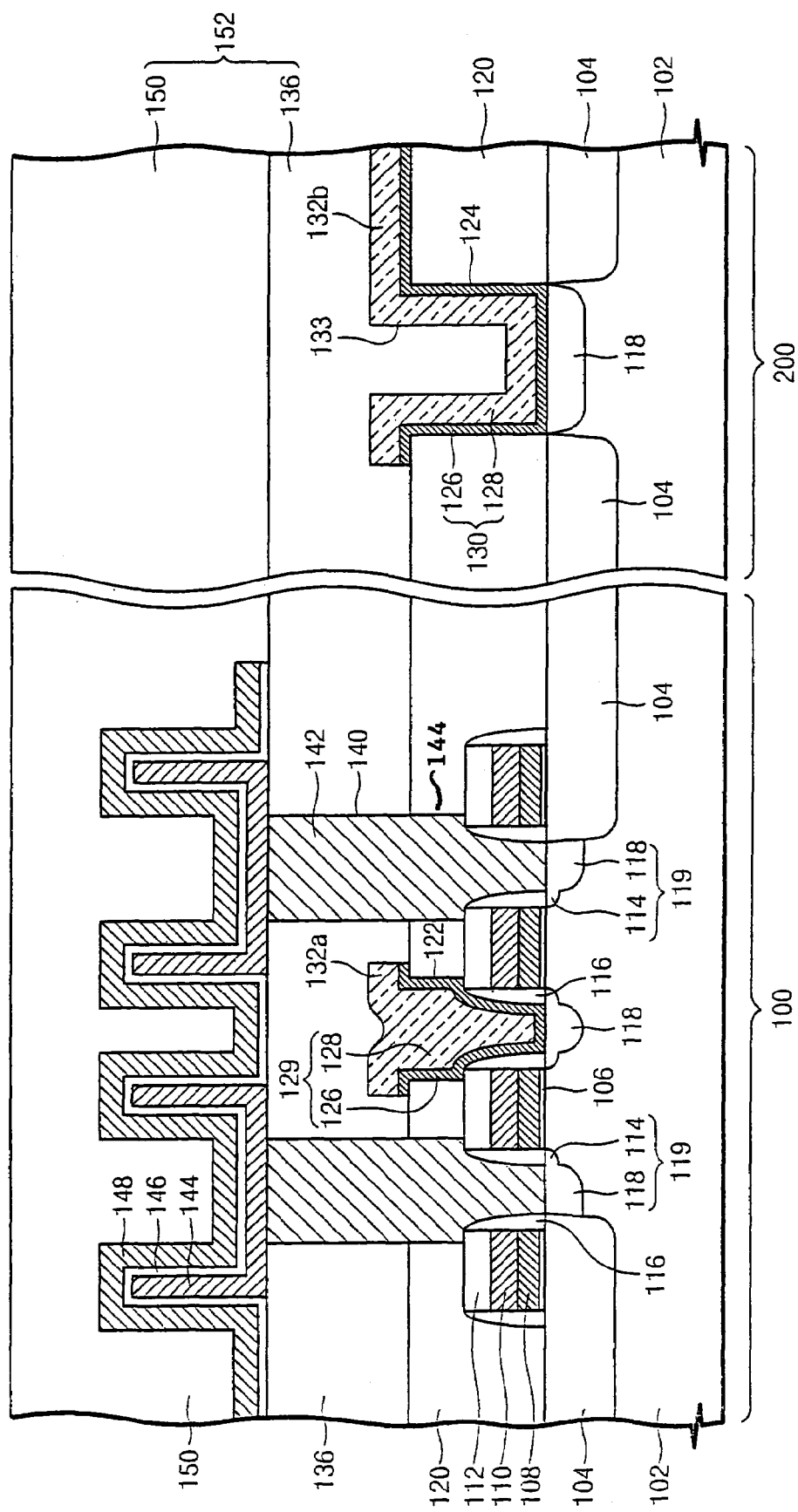

Referring to FIG. 6, in the cell area 100, the second interlayer insulating layer 136 is formed on the bit line 132a and the first interlayer insulating layer 120. Then, the opening 140 and the fourth hole 144 are formed to pass through the second interlayer insulating layer 136 and the first interlayer insulating layer 120 to expose the source region 119 of MOS transistor. Thereafter, the opening 140 and the fourth hole 144 are filled with polysilicon to form the conductive contact plug 142. The capacitor is formed on the second interlayer insulating layer 142 in which the contact plug 142 is formed. The capacitor can be formed using various conventional methods. For example, the capacitor can be formed in a cylinder, a pin, a stack, etc. configuration. As illustrated in FIG. 6, the capacitor is formed in the cylinder configuration. A cylinder type lower electrode 144 is formed, and then a dielectric layer 146 is formed inside/outside the lower electrode 144 and on the second interlayer insulating layer 136. An upper-electrode conductive layer is formed on the dielectric layer 146 and patterned to thereby form the upper electrode 148. The third interlayer insulating layer 150 is formed on the capacitor and the second interlayer insulating layer 136 and is planarized.

In the peripheral circuit area 200, the upper interlayer insulating layer 152 is formed on the lower contact 130, the interconnection line 132b and the lower interlayer insulating layer 120. The upper interlayer insulating layer 152 includes the second interlayer insulating layer 136 and the third interlayer insulating layer 150.

Figure 7:
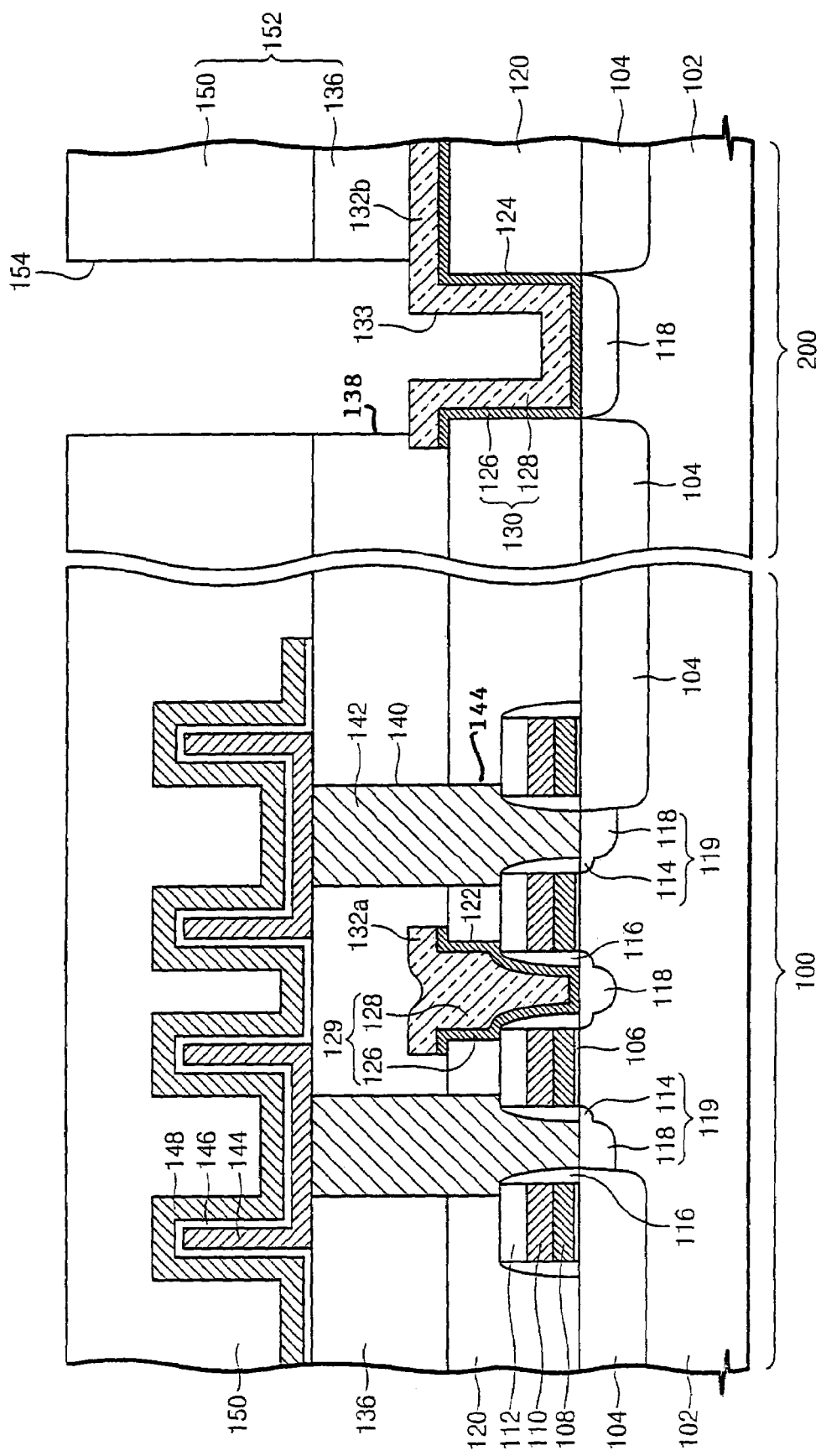

Referring to FIG. 7, in the peripheral circuit area 200, the upper interlayer insulating layer 152 is selectively etched to form the upper contact hole 154 and the second hole 138 exposing the lower contact 130 in which the groove 133 is formed.

Referring again to FIG. 2, in the peripheral circuit area 200, the second barrier metal 156 and the second conductive layer 158 are formed inside the upper contact hole 154 and on an upper portion of the interlayer insulating layer 150, thereby forming the upper contact 160 and the metal interconnection 162. The second barrier metal 156 can be formed of titanium (Ti) and/or titanium nitride (TiN). A chemical vapor deposition (CVD) process can be used to form the second barrier metal 156. The first conductive layer 128 can be formed of tungsten (W). A CVD process can also be used to form the first conductive layer 128.

In the cell area, the metal interconnection 162 including the second barrier metal 156 and the second conductive layer 158 is formed on the third interlayer insulating layer 150.

As described above, in some embodiments of the present invention, a CMP process may not need to be carried out in forming the contact structure for connecting the lower contact and the upper contact. Thus, it is possible to reduce or prevent an occurrence of defects. Further, conductive contact structures according to other embodiments of the invention can be formed using simplified processes. Finally, in accordance with some embodiments of the present invention, a unified contact structure may be provided, in which the grooves formed inside the lower contact are filled with the upper contact. Thus, it is possible to form a stable contact structure.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating an integrated circuit comprising:
    forming a first insulating layer on a substrate;
    forming a first hole passing through the first insulating layer and including a floor adjacent the substrate and a sidewall, and forming a third hole passing through the first insulating layer;
    conformally forming a first conductive contact on the sidewall and floor to define a groove in the first hole, and simultaneously forming a third conductive contact in the third hole;
    forming a second insulating layer on the first insulating layer remote from the substrate;
    forming a second hole passing through the second insulating layer and exposing the groove;
    forming a third insulating layer on the second insulating layer remote from the first insulating layer that includes therein a sixth hole that exposes the second hole;
    forming a second conductive contact in the second hole, in the groove and in the sixth hole;
    forming a fifth hole in the second insulating layer;
    forming a fourth hole in the first insulating layer beneath the fifth hole;
    forming a fourth conductive contact in the fourth and fifth holes; and
    forming a capacitor on the second insulating layer that is electrically connected to the fourth conductive contact.

2. A method according to claim 1 wherein the step of forming a first insulating layer on a substrate comprises forming a first insulating layer directly on the substrate such that the floor is directly on the substrate.

3. A method according to claim 1 wherein The step of forming a second conductive contact comprises forming a second conductive contact to fill the second hole, the groove and the sixth hole.

4. A method according to claim 1:
wherein the step of conformally forming a first conductive contact comprises forming a first barrier layer on the sidewall and floor and forming a first conductive layer on the first barrier layer remote from the sidewall and floor; and
wherein the step of forming a second conductive contact comprises forming a second barrier layer on the first conductive layer and forming a second conductive layer on the second barrier layer remote from the first conductive layer.

5. A method according to claim 4 wherein the first and second barrier layers comprise chemical vapor deposited titanium and/or titanium nitride and wherein the first and second conductive layers comprise chemical vapor deposited tungsten.

6. A method according to claim 1 wherein the step of conformally forming a first conductive contact comprises conformally forming a first conductive contact on the sidewall and floor and extending onto the first insulating layer outside the first hole.

7. A method according to claim 1 wherein the step of forming a second conductive contact comprises forming a second conductive contact in the second hole, in the groove and extending onto the second insulating layer outside the second hole.

8. A method according to claim 1 wherein the step of forming a second conductive contact further comprises forming a second conductive contact in the second hole, in the groove, in the sixth hole and extending onto the third insulating layer outside the sixth hole.

9. A method according to claim 1 wherein the first hole is at least twice as wide as a thickness of the conformal first conductive contact.

10. A method according to claim 1 wherein the step of conformally forming a first conductive contact on the sidewall and floor to define a groove in the first hole and simultaneously forming a third conductive contact in the third hole comprises:
conformally forming a barrier layer conductive layer on the sidewall and floor and in the third contact hole;
forming a conductive layer on the barrier layer in the first hole to define the groove and on the barrier layer in the third hole to fill the third hole; and
patterning the barrier layer conductive layer and the conductive layer to form the first conductive contact and the third conductive contact.

* * * * *